(12) United States Patent
Nelson et al.

(10) Patent No.: US 11,193,975 B2
(45) Date of Patent: Dec. 7, 2021

(54) COMPRESSED TEST PATTERNS FOR A FIELD PROGRAMMABLE GATE ARRAY

(71) Applicant: Intel Corporation, Santa Clara, CA (US)

(72) Inventors: Christopher J. Nelson, Gilbert, AZ (US); Shelby G. Rollins, Hillsboro, OR (US); Hiren V. Tilala, Chandler, AZ (US); Matthew Hendricks, Redwood City, CA (US); Sundar V. Pathy, Chandler, AZ (US); Timothy J. Callahan, Hillsboro, OR (US); Jared Pager, Portland, OR (US); James Neeb, Gilbert, AZ (US); Bradly Inman, Hillsboro, OR (US); Stephen Sturges, Portland, OR (US)

(73) Assignee: Intel Corportion, Santa Clara, CA (US)

( * ) Notice: Subject to any disclaimer, the term of this patent is extended or adjusted under 35 U.S.C. 154(b) by 628 days.

(21) Appl. No.: 16/024,722

(22) Filed: Jun. 29, 2018

(65) Prior Publication Data

US 2020/0003836 A1    Jan. 2, 2020

(51) Int. Cl.
*G01R 31/3183*  (2006.01)
*G01R 31/3185*  (2006.01)
(Continued)

(52) U.S. Cl.
CPC ... *G01R 31/318335* (2013.01); *G01R 31/316* (2013.01); *G01R 31/31703* (2013.01);
(Continued)

(58) Field of Classification Search
CPC ...... G01R 31/318335; G01R 31/31703; G01R 31/318547; G01R 31/316; G01R 31/318519
See application file for complete search history.

(56) References Cited

U.S. PATENT DOCUMENTS

| | | | | |
|---|---|---|---|---|
| 2007/0234157 | A1* | 10/2007 | Rajski | G01R 31/318563 714/728 |
| 2011/0276850 | A1* | 11/2011 | Luu | G06F 11/27 714/733 |
| 2019/0260380 | A1* | 8/2019 | Carlough | H03L 7/081 |

OTHER PUBLICATIONS

M. Rozkovec, J. Jeníček and O. Novák, "Application dependent FPGA testing method using compressed deterministic test vectors," 2010 IEEE 16th International On-Line Testing Symposium, Corfu, Greece, 2010, pp. 192-193. (Year: 2010).*

(Continued)

*Primary Examiner* — Cynthia Britt
(74) *Attorney, Agent, or Firm* — Schwabe, Williamson & Wyatt, P.C.

(57) ABSTRACT

Embodiments herein relate to apparatus, systems, and methods to compress a test pattern onto a field programmable gate array to test a device under test. This may include identifying values of a plurality of drive pins for a plurality of test cycles to apply to an input of the DUT for each of the plurality of test cycles, identifying values of a plurality of compare pins for the plurality of test cycles to compare an output of the DUT, respectively, for each of the plurality of test cycles, analyzing the identified values, compressing, based on the analysis, the values of the plurality of drive pins and the plurality of compare pins, and storing the compressed values on the FPGA.

20 Claims, 10 Drawing Sheets

(51) Int. Cl.
*G01R 31/316* (2006.01)
*G01R 31/317* (2006.01)
(52) U.S. Cl.
CPC ............ *G01R 31/318519* (2013.01); *G01R 31/318547* (2013.01)

(56) References Cited

OTHER PUBLICATIONS

L. Ciganda, et al "An enhanced FPGA-based low-cost tester platform exploiting effective test data compression for SoCs," 2009 12th International Symposium on Design and Diagnostics of Electronic Circuits & Systems, Liberec, Czech Republic, 2009, pp. 258-263. (Year: 2009).*

Gang Zeng and H. Ito, "Non-intrusive test compression for SOC using embedded FPGA core," 19th IEEE International Symposium on Defect and Fault Tolerance in VLSI Systems, 2004. DFT 2004. Proceedings., Cannes, France, 2004, pp. 413-421. (Year: 2004).*

* cited by examiner

FIG. 1A

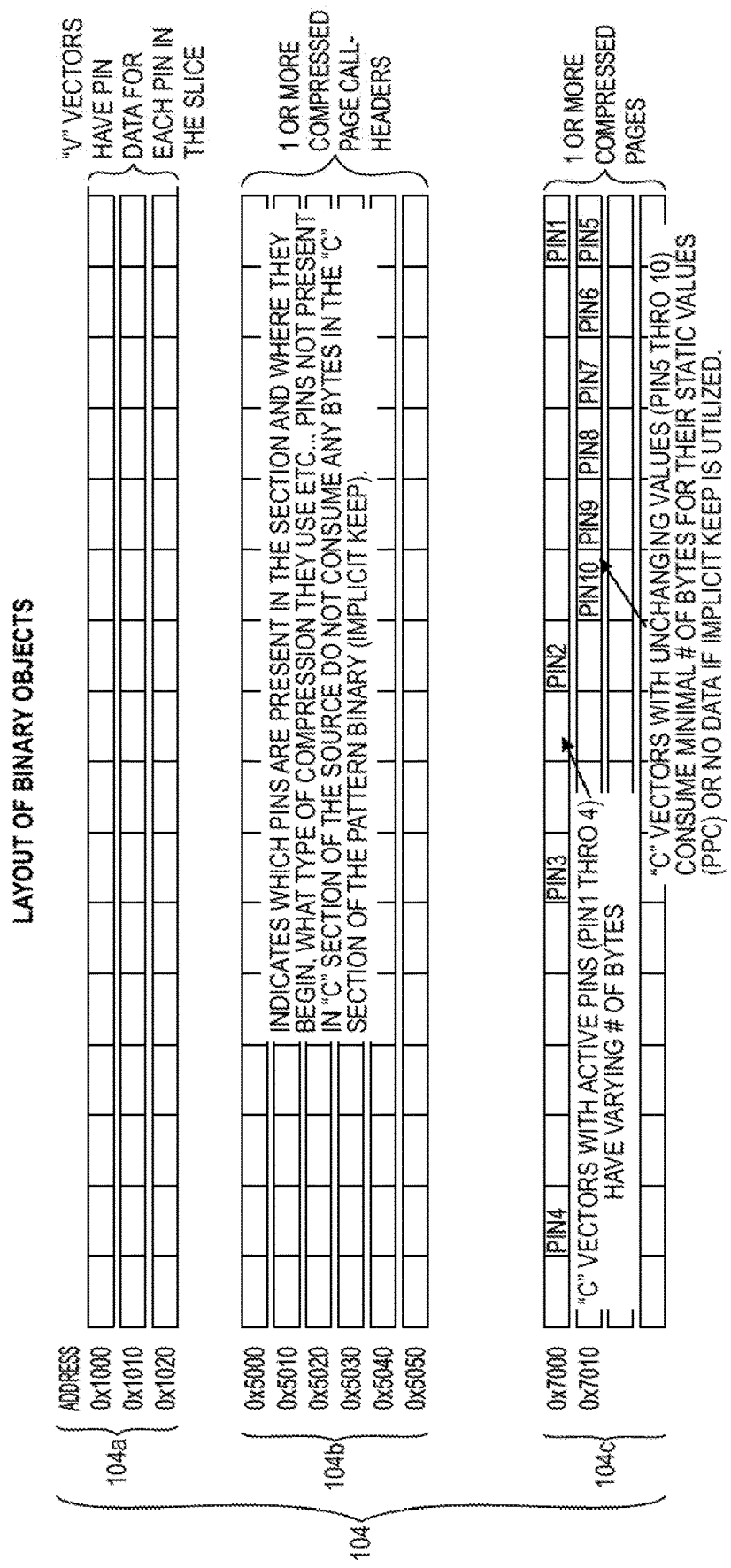

FIG. 7

175 COMMON CHANNELS

| SLICE 0 | | | | | | | | | | | | | | | | | | | | | | | | | | | | | | | | | | |
|---|---|---|---|---|---|---|---|---|---|---|---|---|---|---|---|---|---|---|---|---|---|---|---|---|---|---|---|---|---|---|---|---|---|---|
| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 |
| SLICE 1 | | | | | | | | | | | | | | | | | | | | | | | | | | | | | | | | | | |
| 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 | 60 | 61 | 62 | 63 | 64 | 65 | 66 | 67 | 68 | 69 |
| SLICE 2 | | | | | | | | | | | | | | | | | | | | | | | | | | | | | | | | | | |
| 70 | 71 | 72 | 73 | 74 | 75 | 76 | 77 | 78 | 79 | 80 | 81 | 82 | 83 | 84 | 85 | 86 | 87 | 88 | 89 | 90 | 91 | 92 | 93 | 94 | 95 | 96 | 97 | 98 | 99 | 100 | 101 | 102 | 103 | 104 |
| SLICE 3 | | | | | | | | | | | | | | | | | | | | | | | | | | | | | | | | | | |
| 105 | 106 | 107 | 108 | 109 | 110 | 111 | 112 | 113 | 114 | 115 | 116 | 117 | 118 | 119 | 120 | 121 | 122 | 123 | 124 | 125 | 126 | 127 | 128 | 129 | 130 | 131 | 132 | 133 | 134 | 135 | 136 | 137 | 138 | 139 |
| SLICE 4 | | | | | | | | | | | | | | | | | | | | | | | | | | | | | | | | | | |
| 140 | 141 | 142 | 143 | 144 | 145 | 146 | 147 | 148 | 149 | 150 | 151 | 152 | 153 | 154 | 155 | 156 | 157 | 158 | 159 | 160 | 161 | 162 | 163 | 164 | 165 | 166 | 167 | 168 | 169 | 170 | 171 | 172 | 173 | 174 |

COMPRESSED TEST PATTERNS FOR A FIELD PROGRAMMABLE GATE ARRAY

FIELD

Embodiments of the present disclosure generally relate to the field of package assemblies, and in particular package assembly testing.

BACKGROUND

Continued adoption and upgrading of mobile electronic devices such as smart phones and ultrabooks is a driving force for the increased demand for testing packages and other components within these electronic devices.

BRIEF DESCRIPTION OF THE DRAWINGS

FIG. 1A illustrates a high-level example of a user syntax for describing compression of test pattern data, in accordance with embodiments.

FIG. 1B illustrates a high-level example layout of binary objects resulting from a compiled description of compression of test pattern data, in accordance with embodiments.

FIG. 7 illustrates device under test (DUT) tester channels, in accordance with embodiments.

DETAILED DESCRIPTION

Figure 2:
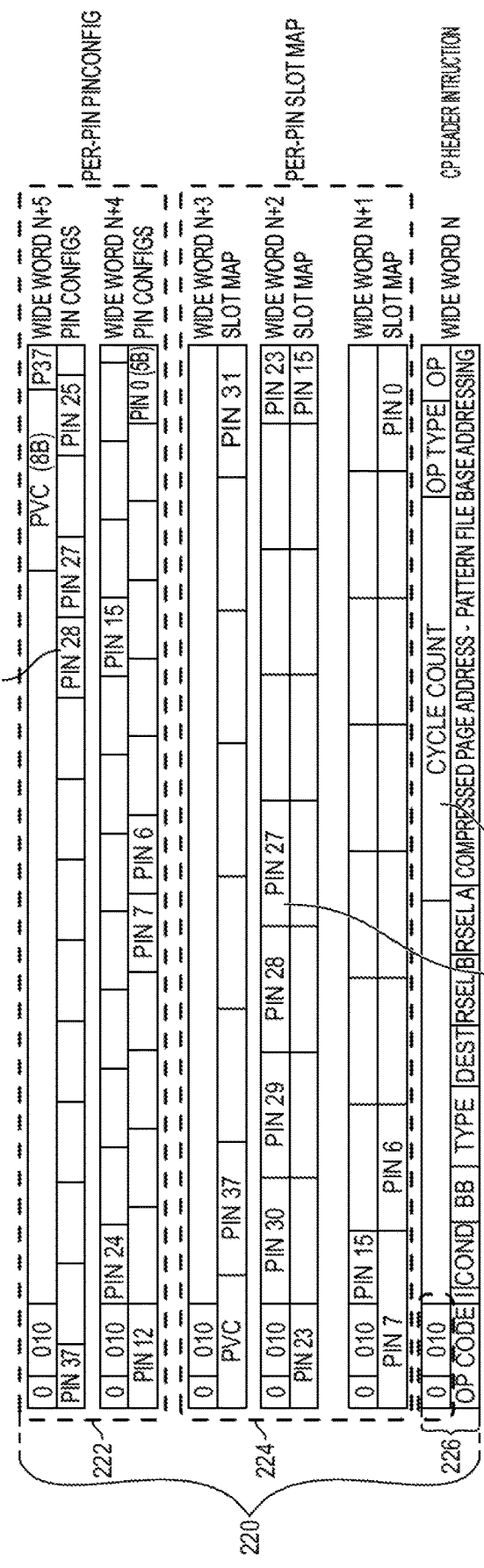
FIG. 2 illustrates an example of a compressed call header instruction and encodings, in accordance with embodiments.

Embodiments of the present disclosure may generally relate to systems, apparatus, and/or processes directed to the compressing of test patterns that are used to perform quality control and other analysis of devices under test (DUT). These compressed test patterns may be implemented, for example, in High Density Modular Testor (HDMT) channel cards that provide digital interfaces to a DUT. Embodiments directed to the compressing of test patterns may be referred to herein as a channel tester card compressed pattern architecture.

In embodiments, the channel tester card compressed pattern architecture may implement three new pattern data compression techniques: implicit keep, serial pattern data in compressed pages, and per-pin compression. In embodiments, implicit keep may allow for using no pattern storage for pins that do not change for a range of tester cycles. Serial pattern data may be stored in compressed pages organized as pattern data per-pin, rather than across all pins for a given slice of time as with legacy vectors. Per-pin compression may allow encoding longer runs of unchanged pin state in a single byte of pattern data. In embodiments, scan pattern mode may use pattern memory data more efficiently, for example, by storing 1 bit for every tester cycle for a DUT input pin (1 or 0) and 2 bits for every cycle for a DUT output pin (1, 0, or X). This may be implemented in a fashion similar to "pin mode" as described below. These embodiments may be referred to as "channel linking."

Embodiments of the present disclosure may also generally relate to distributing a large number of digital test channels to DUTs that may be tested in parallel in a burn-in platform. Some of these embodiments may instantiate several copies of a channel tester card compressed pattern architecture logic onto an FPGA, for example a large Stratix® 10 Pattern generating (Patgen) FPGA, and may use a high-speed distribution bus to a series of endpoint FPGAs which may play the test pattern cycles simultaneously on a number of DUTs.

In legacy implementations, in relation to test pattern storage efficiency, test patterns on automated test equipment (ATE) can consume hundreds of gigabytes of space on disk and when loaded onto the test equipment instrument cards. The required size of these test patterns scales with the number of transistors in the DUT, with test coverage required due to increased fabrication defect levels and increased layout sensitivity as process nodes continue to shrink. Size of the test patterns are also increasing due to the use of more advanced test methods such as automatic test pattern generators (ATPG) that may examine circuits and automatically create inputs to test portions of the circuits and circuit functions. Legacy implementations with no or limited scan pattern memory features may not scale to forecasted test pattern depths.

In legacy implementations, the architectural problem with current test pattern storage is that test vectors are stored explicitly for every vector cycle, and on every "slice" where a slice may be a group of tester pins/channels. In legacy implementations there may be a number of channels corresponding to a power of 2, regardless of the activity level on each pin. For example, a 128 bit wide test interface bus of a test program may take 590 million test vectors over 350 tester channels, requiring 66 GB of pattern storage space. The test pattern storage method used in legacy testers may be difficult to scale for greater test pattern depth.

Legacy implementations regarding test pattern storage efficiency in ATEs, may include channel linking and scan pattern mode. Channel linking allows use of the test pattern memory from nearby channels within the channel card instrument. Scan pattern mode uses the pattern memory data more efficiently by storing 1 bit for every tester cycle for a DUT input pin (drive 1 or 0), and 2 bits for every cycle for a DUT output pin (allowing for expect 1, 0, or X). Normal (non-scan pattern mode) vectors typically require 3 or 4 bits per pin per cycle, providing much greater flexibility cycle-to-cycle. The vast majority of tester cycles may not need this flexibility.

Regarding test pattern storage efficiency, channel linking requires that the tester be populated with 2 to 16 times as many tester channels than are active on the DUT during most of the testing just in order to provide more test pattern space. This may be an expensive way to solve the pattern memory space problem, and often may run into limitations for how many channel card instruments can fit within the tester chassis and how many DUTs can be tested in parallel.

Legacy implementations regarding package test pattern capability at burn-in, may include only test content applied on a narrow DUT test port due to few available tester channels. Legacy implementations do not appear to provide wide test port capability in a high density burn-in targeted module.

In legacy implementations, in relation to package test pattern a capability at burn-in, semiconductor burn-in system test content "driver" electronics usually limit connections to the DUT to just a few tester channels, typically to just an IEEE 1149.1 "TAP" port and a few control signals such as the DUT clocks and reset. The amount of content that can be applied to the DUT in burn-in is limited by this narrow test access. For example, 1 minute of package test time with test content applied via 128 DDR port pins at 100 MHz will take more than 2 hours if applied via the TAP port only. Consider that the product may have a burn-in time target of 5 minutes. In legacy implementations, applying the high volume of Class-pattern content in burn-in may be used to effectively and efficiently accelerate infant mortality defects in order to meet quality requirements on advanced process nodes.

Therefore, in legacy systems it may be difficult to apply a large, high coverage test pattern set over a TAP-only interface typically available in burn-in system drivers. For legacy high tester channel count architectures, the tester channel card logic has to be replicated for each DUT, which may be difficult for burn-in due to physical space and equipment costs constraints.

Embodiments described herein may provide a high tester channel count thus enabling acceptable test time, high pattern depth using the channel tester card compressed pattern architecture compression methods, and high physical space density.

Based on a study of more than 22,000 test patterns for a known processor, just applying industry-known Scan Pattern Mode compression achieves about 50% reduction in test pattern memory consumption. The channel tester card compressed pattern architecture achieves greater than 90% reduction (in some cases greater than 99% reduction) in test pattern memory consumption. These methods effectively provide an order-of-magnitude increase in pattern memory space (4 GV becomes in the order of 40 GV); thus eliminating the need for high-cost Channel Linking and enabling higher testing parallelism.

In embodiments, a compressed pattern architecture may enable running a full suite of package test pattern content in the burn-in environment with 16× parallelism. This may result in increased quality for example through much more effective burn-in stress, and in decreased cost.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

Figure 1A:
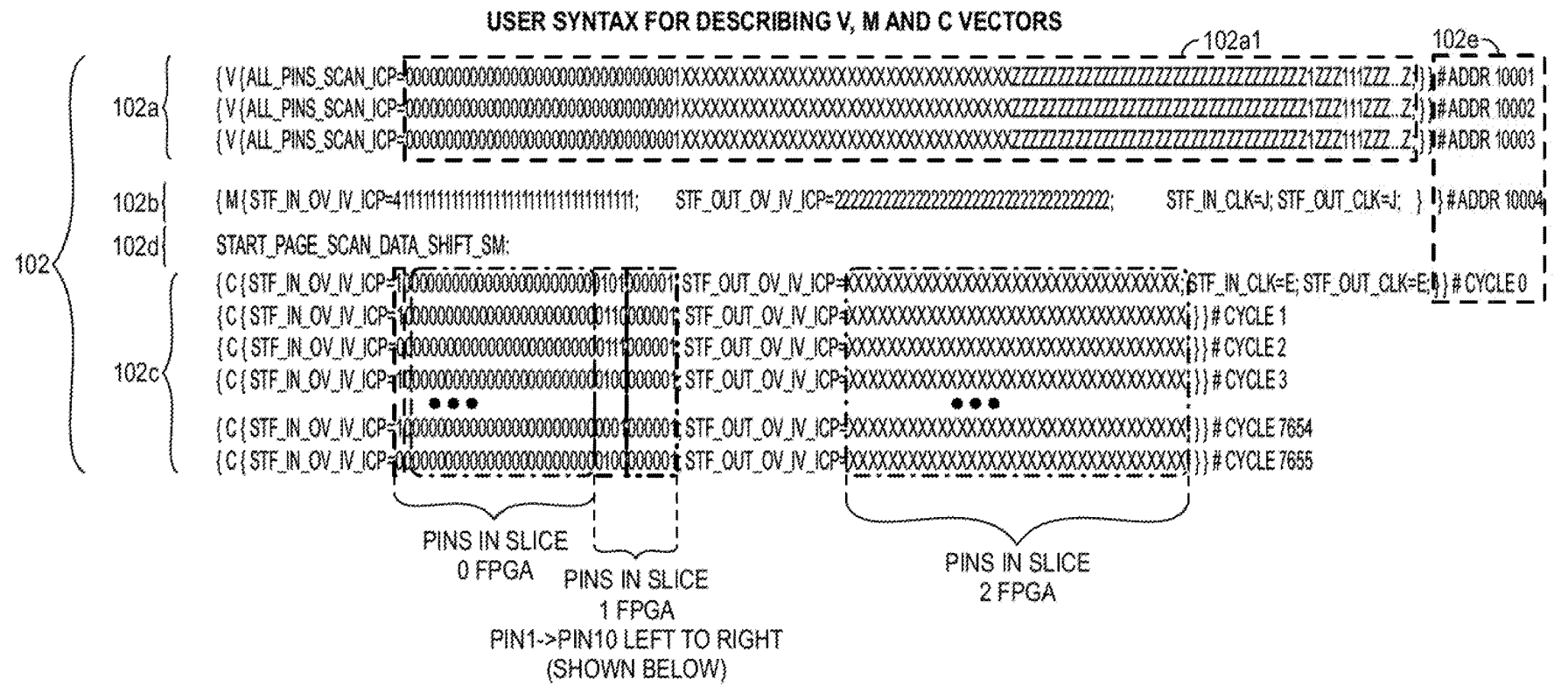

FIG. 1A illustrates a high-level example of a user syntax for describing compression of test pattern data, in accordance with embodiments. A tester channel card sequence of vectors 102 shows an example of statements in a high-level language that express how testing pattern data may be compressed. The sequence of vectors 102 may also be referred to as a sequence of statements. The vectors 102 may be used to indicate compression techniques that may include implicit keep, serial pattern data in compressed pages, and/or per pin compression.

In embodiments, software tools (not shown) may process the sequence of vectors 102 to produce a tester channel card compressed pattern, such as compressed pattern file 104 as shown in FIG. 1B. In embodiments, the software tools (not shown) may function analogously to a compiler to produce data to store in a tester channel card compressed pattern file 104. It should be noted that the tester channel card compressed pattern file 104 may be loaded onto tester channel cards and pattern decompression logic may be implemented in the tester channel card pattern generator FPGA, which may also be referred to as the Patgen FPGA, discussed further below.

A pin may refer to a pin on a semiconductor package or other package. A pin on a package may be an input pin or an output pin and may have a value of either "1", which may correspond to high-voltage on the pin, or "0" which may correspond to a low-voltage on the pin. With respect to embodiments herein, for testing, an input pin may be referred to as a drive pin to the DUT and an output pin may be referred to as a tester compare pin.

In embodiments, the tester channel card compressed pattern file 104 may be used to identify, for each tester cycle for the DUT, values of drive pins and acceptable values for corresponding compare pins.

Figure 5:
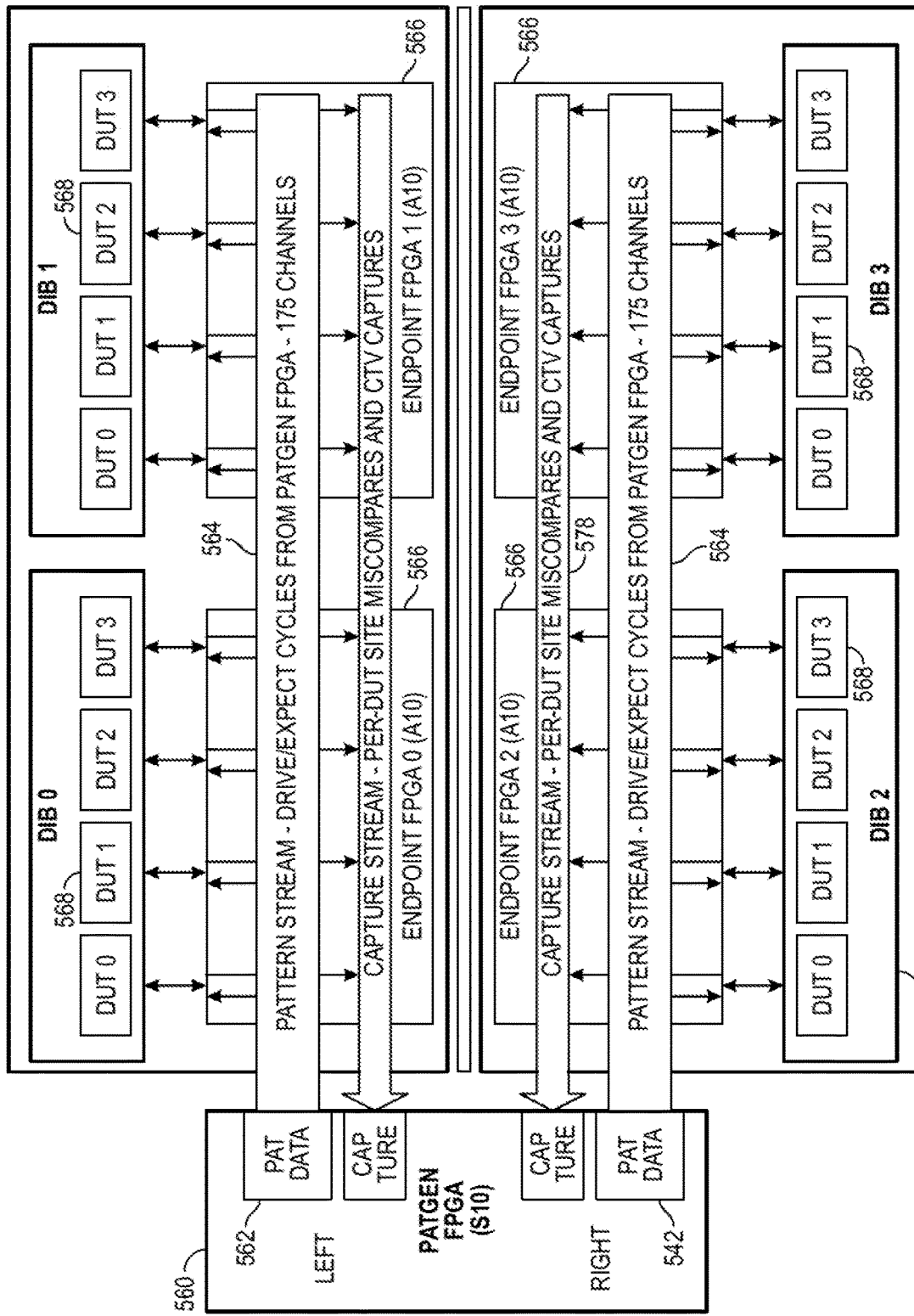
FIG. 5 illustrates an example distributed pattern generator (Patgen) topology with a main Patgen field programmable gate array (FPGA) and several endpoint FPGAs, in accordance with embodiments.

In embodiments, a V vector 102a may be used to explicitly identify pin data 102a1 for each pin, whether a drive pin or a compare pin, for a tester cycle without compression in a slice. In embodiments, there may be multiple slices that have different pin values on the slice. Which pins are on which slices may be set by the design of the device interface board (DUT) as shown in FIG. 5. In embodiments, the boundaries of a slice may vary, and may be 128 bit wide pattern words, which may correspond to up to 38 channels of 3 bit symbols plus control bits. For example, there are 5 slices shown in FIG. 6.

V vectors 102a, as well as M vectors 102b or C vectors 102c described below, may indicate drive pin values of "0" or "1" and compare pin values of "0", "1", "Z" or "X", where "Z" may indicate some other value, such as high impedance, and "X" may indicate the compare result for that pin is to be ignored, which may also be referred to as a "mask." In embodiments, the values of drive pins may be indicated by 1 binary digit (bit). The values of compare pins may be indicated by 2 or more bits. The number of bits required to indicate a value of a pin may be referred to as a "pin mode."

V vectors 102a may have a representation of pin values for every pin for a particular testing cycle. These representations may be stored in memory 104, for example at file location 104a.

In embodiments, M vectors 102b may proceed C vectors 102c and may provide pin values for all pins referred to in C vectors 102c, as well as other information relevant to this C vectors 102c. M vectors 102b may also identify pins and values for those pins that are unchanged by C vectors 102c that follow an M vector 102b. This indication of the pins and pin values that are unchanged may be referred to as implicit keep compression.

During compilation or interpretation, the M vector 102b may be considered to be a pragma or compiler directive vector that specifies a pin mode for the compression. In embodiments, the M vector 102b identifies pin modes for all pins referred to in the C vectors 102c that follow the M vector 102b. Active pins may be assigned an encoding of 0, 1, 2, or 3 where the encoding indicates how data will be sourced for the active pins (e.g. single bit mode, 2 bit mode, 3 bit mode, or no data for this pin).

In embodiments, for C vectors 102c that follow M vectors 102b, the first C vector that immediately follows the M vector 102b is to assign a pin value for every pin identified in the M vector 102b. As discussed further below, in embodiments, each C vector 102c may be associated with one or more call headers, which may be similar to call header 220 of FIG. 2. Each call header may be associated with a compressed page, which may be similar to compressed page 330 of FIG. 3. In embodiments, file location 104b may store one or more call headers, and file location 104c may store one or more compressed pages.

In embodiments, the text 102d, 102e may be considered comment text that is not compiled or interpreted.

FIG. 2 illustrates an example of a compressed call header instruction and encodings, in accordance with embodiments. Call header 220 may be stored in file location 104b of FIG. 1B. In embodiments, call header 220 may include three sections: a PinConfig 222; pin slot map 224, and compressed page header instruction 226.

In embodiments, the PinConfig 222 section may include configuration information of each pin in the slice. The PinConfig section 222 may include a PinConfig field 222a for one or more pins. In embodiments, the PinConfig field 222a may specify if and what kind of data exists for this pin in the compressed page 330.

In the example shown in FIG. 2, there are 38 pins in one FPGA slice. Each PinConfig field 222a may include PinData information that may include PinMode information and PinState information. Pins with values that do not change for the cycle range of the associated compressed page 330 may have PinMode set to NoData and a fixed pin value placed in the PinData field. These pins will have no data stored within the associated compressed page 330. The PinMode=NoData setting provides the implicit keep feature. If a pin has activity within the cycle range of the compressed page then the PinMode may be set to 1 bit mode for a DUT input pin, a 2 bit mode for a DUT output pin, or a 4 bit mode. For example, 1 bit mode stores 8 tester cycles of activity for each byte in the associated compressed page 330.

TABLE 1

| Bit positions | PinMode - |
|---|---|
| [4:3] | 11: No Data for this pin within the compressed page. PinState field has fixed pin value for the page. Slot map field ignored. - Implicit Keep and Jammed encoding<br>10: 3b mode - 2 cycles per data byte with upper 2b in data byte ignored. PinState field ignored.<br>01: 2b mode - 4 cycles per data byte. PinState[2] sets upper bit, [1:0] ignored.<br>00: 1b mode - 8 cycles per data byte. Pinstate[2:1] set upper 2 bits, [0] ignored. |
| [2:0] | PinState - 3b code for pins with no data within the page (Implicit Keep or Jammed value), or upper bits values for 2b and 1b modes. |

Table 1 shows one example scheme for encoding Pin-Mode information and PinState information within PinData information stored in 5 bits.

In embodiments, Other test vector attributes, such as per-vector control (PVC) data that may be control bits for each 38 channel data vector, may be similarly encoded. For example, PVC configuration (PVCConfig) information may be stored in a field in the PinConfig 222. PVCmode may indicate how data is to be read.

TABLE 2

| Bit positions | PVCMode - |
|---|---|
| [7:6] | 11: No PVC data within the compressed page. PVCState field ignored. Slot map field ignored.<br>10: 6b mode - Data bytes carry 5b MTV + CTV. 1 cycle per date byte with upper 2b in data byte ignored. PVCState field ignored.<br>01: reserved<br>00: 1b mode - Data bytes carry CTV only. 8 cycles per data byte. PVCState[5:1] set upper bits. |
| [5:0] | PVCState - PVC 6b code from the M vector, or fixed 6'b000000. [5:1] are MTC, [0] is CTV. |

Table 2 shows one example scheme for encoding PFC-Config in an 8 bit field.

Figure 3:
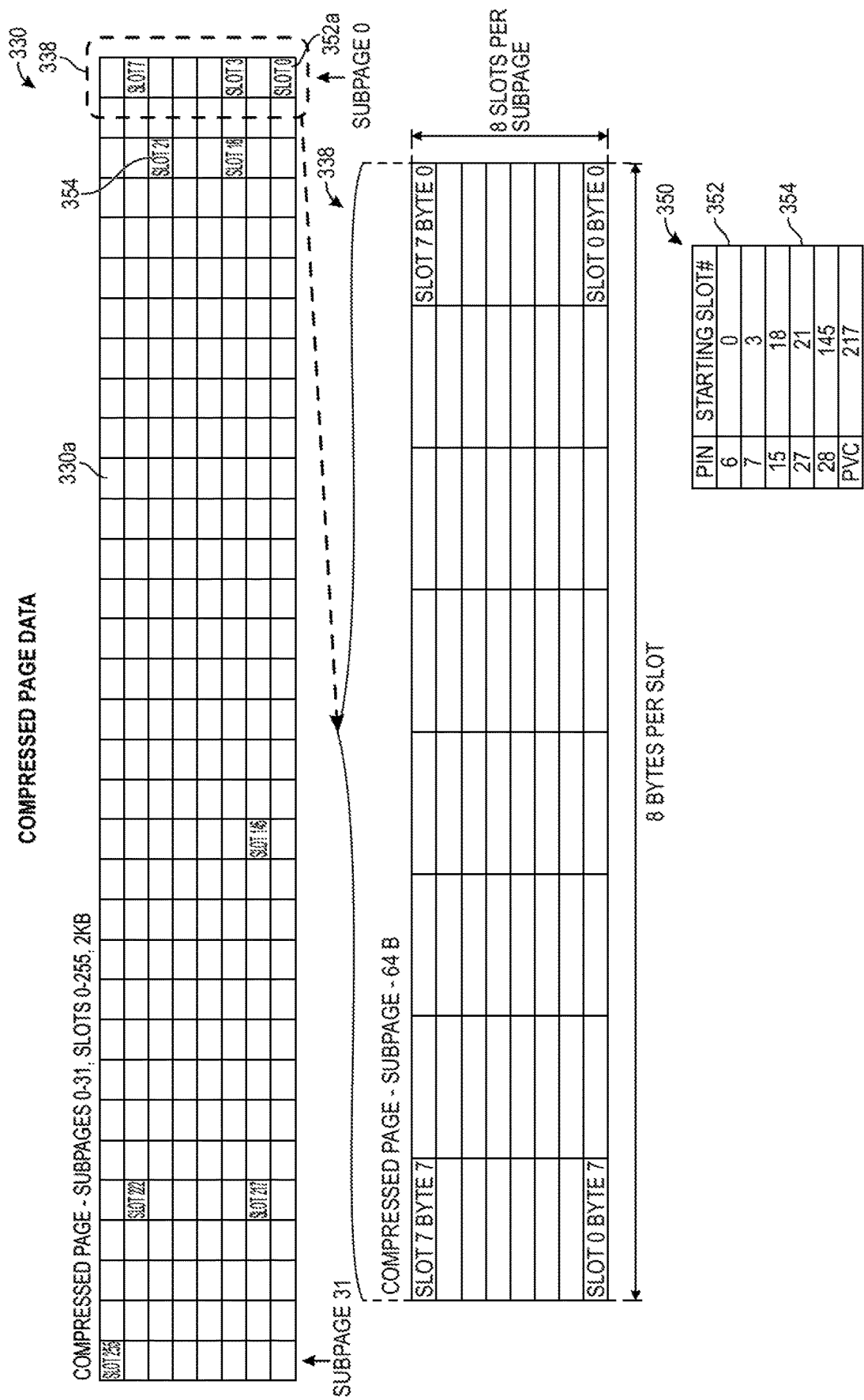
FIG. 3 illustrates an example of compressed page data, in accordance with embodiments.

In embodiments, the slot map 224 may include a memory map per pin into the associated compressed page 330 of FIG. 3 for the call header 220. In embodiments, each slot map field 224 may be 8 bits long. In embodiments, the slot map 224 may be used if the PinMode is 3 bits, 2 bits, or 1 bit, and may be ignored if the PinMode is NoData.

In embodiments, the compressed page header instruction 226 may include the number of tester cycles that may be generated from data in the compressed page 330. In embodiments, this may be the number of tester cycles that Patgen decompression logic should generate from data in the compressed page 330. In embodiments, based on the number and activity level of pins in the slice, a compressed page can represent from a few hundred cycles to billions of cycles.

In embodiments, the compressed page header instruction 226 may include the address of the compressed page 330. In embodiments, the address may be set by pattern compilation tools as the compressed page 330 may be allocated on each slice.

FIG. 3 illustrates an example of compressed page data, in accordance with embodiments. Compressed page 330 may be a 2 kilobyte (kB) block of memory that includes compressed data only for pins that have activity within the window of tester cycles represented by the compressed page. A compressed page 330 may be associated with one call header 220. In embodiments, a compressed page 330 may be split into subpages 338.

For pins that have data in the compressed page 330, pin data may start in byte 0 of the address indicated by the slot map for the pin included in the call header 220. The pin data may then continue into successive slots 330a of the compressed page 330 the number of tester cycles 226a identified for the pin in the call header 220. In embodiments, the successive slots may not have command bytes in byte 0, as discussed further below.

Compressed page 330 is an example memory map for six pins that have activity within the range of the compressed page. In embodiments, the 2 kB compressed pages are addressable for pin data at 8 byte resolutions, providing 256 possible starting addresses for slots 330a that contain pin data. With 256 possible starting slots 330a for pin data, the call header 220 contains an 8 bit address for each pin in the slice. For pins with their PinMode=NoData, their slot start address field may be ignored. For a pin with activity within the number of tester cycles 226a of the compressed page, its slot start address field will point to one of 256 possible slots in the compressed page. Each pin may consume as many consecutive bytes in the compressed page as needed.

For example, diagram 350 in FIG. 3, shows compressed page 330 data for five pins (6, 7, 15, 27, 28) and PVC data. In diagram 350, data for pin 6 352 starts in slot 0 352a and consumes only two slots, while data for pin 27 354 starts in slot 21 354a and consumes about one half of the 2 kB compressed page 330. The number of cycles produced for pins is the same as set by the number of tester cycles 226a identified for the pin in the call header 220, while the physical data they consume within the compressed page 330 is variable.

Data in slots 330a may be encoded using command bytes, which may be similar to PinData described above, to provide compressed page 330. In embodiments, the first byte in a slot 330a for a pin may be a command byte. This introduces run-length encoding by embedding command bytes within pin data streams in a compressed page 330. Within a command byte, the most significant bit (e.g. bit 7) determines an action and the meaning of the bits 6-0.

Command byte either indicates that the prior pin state should be repeated for up to 1024 cycles, or that the following number of bytes contain pin data per the PinMode (1 bit/2 bit/4 bit) encoding indicated in the call header 220 for the pin. After the action specified by a Command byte, the next byte in the pin data stream will be interpreted as another Command byte. For example, after a Per-Pin Compression Command byte the next byte will be interpreted as another Command byte. The Command byte scheme provides the Per-Pin Compression feature of this invention. A study of processor test patterns shows long run-lengths of fixed pin states on many pins that have some activity (thus not encoded with Implicit Keep)

In embodiments, if bit 7 is set to 0, then pin data is stored in the compressed page 330 for the pin. The value N is the numerical value of bits 6-0. The following N bytes (adjusted for the PinMode) are decompressed to get the pin data. The byte following the N data bytes is another command byte.

In embodiments, if bit 7 is set to 1, then the prior pin value is to be repeated N*8 times, and the next byte is another command byte. Note: in the example in Table 3, the "cycles" column may represent a count in a total uncompressed cycle count of 1187.

TABLE 3

| Binary Data | Decode | Cycles |
|---|---|---|
| 8'h00 | Apply the next 18 per data encoding | |
| 8'h0F (0x0F) | Data 1-1-1-1-0-0-0-0 (1b encoding, LSb first) | 8 |
| 8'hFF | PPC 128 * 8 cycles (prior symbol - 0) | 1024 |
| 8'h02 | Apply the next 3B per data encoding | |
| 8'hAA | Data 0-1-0-1-0-1-0-1 | 8 |
| 8'hF0 | Data 0-0-0-0-1-1-1-1 | 8 |
| 8'h10 | Data 0-0-0-0-0-0-0-1 | 8 |
| 8'h8F | PPC 16 * 8 cycles (last data value - 1) | 128 |
| 8'h01 | Apply the next 1B per data encoding | |
| 8'hAA | Data 0-1-0-~~1-0-1-0-1~~ (1b encoding, LSb first) Cycle count limits to 3 LSbs being used | 3 |

Table 3 shows an example of the use of command bytes.

Figure 4:
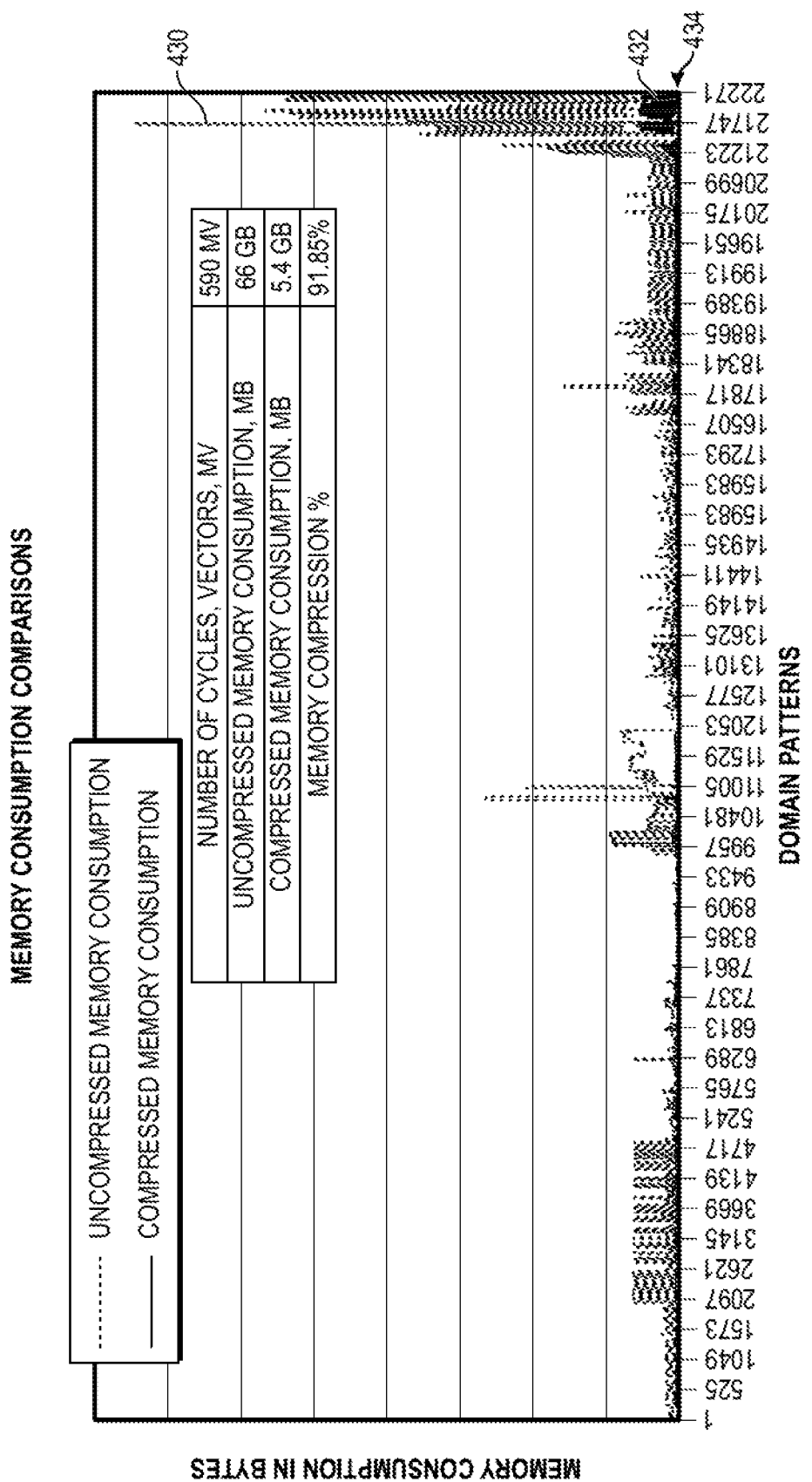
FIG. 4 illustrates results of an example performance test, in accordance with embodiments.

FIG. 4 illustrates results of an example performance test, in accordance with embodiments. FIG. 4 shows pattern compression results for the channel tester card compressed pattern architecture. In summary, the net combined results of implicit keep, scan pattern mode, and per-pin compression shows greater than 90% memory space saving, based on the study of over 22,000 processor test patterns. The dashed data 430 represents the memory consumed for no pattern compression features (other than repeat compression). The total uncompressed memory usage for 590 million vectors (tester cycles) is 66 GB over 320 pins on 7 56-channel slices. The barely-noticeable solid data 432 near the zero line 434 represents the memory consumed for each pattern on the channel tester card compressed pattern architecture when utilizing implicit keep, 1 bit/2 bit scan pattern mode, and per-pin compression. The total channel tester card compressed pattern architecture memory usage is 5.4 GB for the same 590 million vectors; less than 10% of the uncompressed usage.

Not shown, for this same test program, an IEEE 1149.1 "TAP" port domain has 234 pins on 5 slices with 136 million vectors, consuming 10.9 GB. The Legacy domain has only a few active pins. Using the channel tester card compressed pattern architecture compression features the same 136 MV are stored in ~40 MB; a greater than 99% compression ratio. Results are similar when looking at other test patterns.

This data indicates that implicit keep, serial pattern data in compressed pages and per-pin compression inventions may provide greater pattern depths and greater cost savings.

Figure 6:
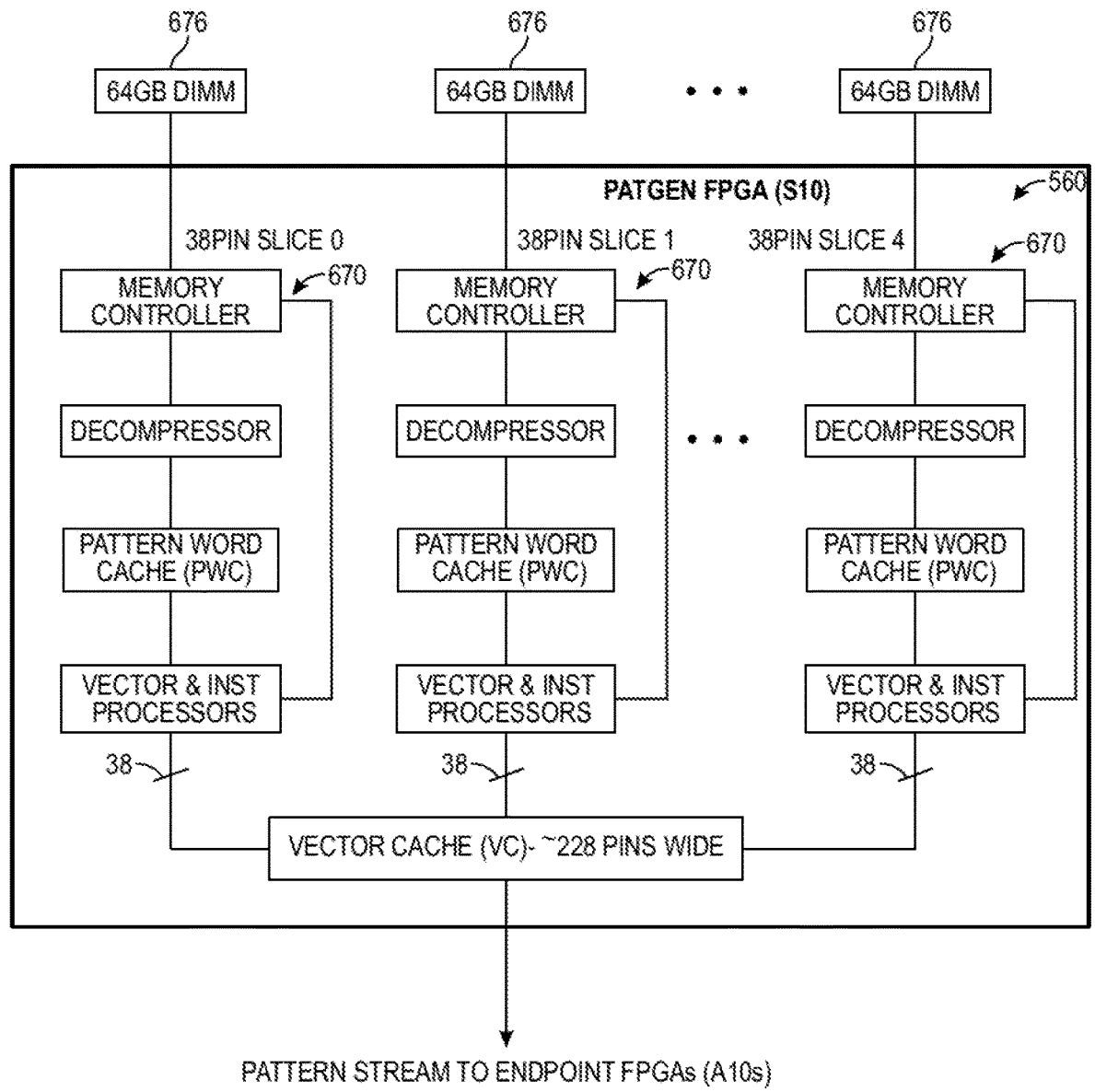
FIG. 6 illustrates a Patgen FPGA topology, in accordance with embodiments.

FIG. 5 illustrates an example distributed Patgen topology with a main Patgen FPGA and several endpoint FPGAs, in accordance with embodiments. In embodiments, FIG. 5 shows an example of a Patgen in a distributed architecture with one main Patgen Altera® Stratix® 10 FPGA instantiating several copies of the channel tester card compressed pattern architecture 562, and high-speed data transmission busses 564 distributing the pattern cycle data to an end point FPGAs by broadcasting the content via direct communication. This may result up to a 16× increase in data throughput to the DUTs 568. getting the platform an effective 16× increase in data through put to the DUTs FIG. 6 illustrates a Patgen FPGA topology, in accordance with embodiments. In embodiments, Patgen FPGA 560 instantiates six channel tester card compressed pattern architecture slices 670 that operate in lock-step (one embodiment shown in FIG. 7 that illustrates DUT tester channels, in accordance with embodiments). For each channel on each cycle the channel data may represent drive states (drive 1/0/Z) or compare states (compare for high/low/mask), as with a typical ATE. The compressed pattern data may be loaded into dual inline memory modules (DIMMs) 676 at test program setup time. Each slice 670 has an dedicated 64 GB DIMM, providing 4 giga-vectors (GV) of uncompressed pattern storage—in the order of 40 GV utilizing the channel tester card compressed pattern architecture mechanisms.

In embodiments, the tester channel data from the Patgen FPGA may be distributed to the Endpoint FPGAs 566 via a number of serial/deserializer high speed interface (SerDes) lanes that may form the Pattern Stream bus 564. This bus may implement a protocol, supporting different types of data packets, including tester cycles, tester cycle metadata, and on-the-fly configuration writes. Pattern Stream bus 564 will be implemented as 16 SerDes lanes at about 10 Gbps, supporting a tester cycle rate up to 200 MHz.

Each Endpoint FPGAs 566 may support up to four DUTs. In embodiments, the Endpoint FPGAs may provide 175 physical tester channels to each DUT (see FIG. 7). The Endpoint FPGAs 566 play the tester cycles from the pattern stream 564 on each connected DUT 568, including checking DUT responses against values expected in the pattern data.

In embodiments, miscompares (fails) between pattern-expected data values and actual DUT responses may be captured as failing cycles and communicated back to the Patgen FPGA via the Capture Stream bus 578. Since it is possible that every DUT may register miscompares simultaneously, the Capture Stream bus is also sized at 16 lanes at about 10 Gbps, and features in the Endpoint FPGA limit the maximum number of miscompares that may be logged in a given window. Miscompare records for each DUT 568 that are received at the Patgen FPGA 560 are stored in the slice DIMMs 676, and captures results are read by software after the pattern burst.

In embodiments, the pattern stream 564 and capture stream 578 busses can be extended to more Endpoint FPGAs 566 to support more DUT 568 test sites. These busses are general purpose point-to-point data transmission busses using standard FPGA technology or using ASIC technology.

In cases where fewer than 4 DUT sockets are placed on a DIB 580, which may also be referred to as a load board or tester interface unit, all available channels may be connected to the DUTs. One application is where a DUT package has two identical die, and test patterns may be applied to both die simultaneously through independent connections.

As a result, the Distributed Patgen Architecture may increase cost effective and highly capable test pattern capability for burn-in applications. The architecture may enable running Sort/Class ATE type test pattern content in a highly parallel burn-in configuration, increasing burn-in quality effectiveness and test time efficiency.

Figure 8:
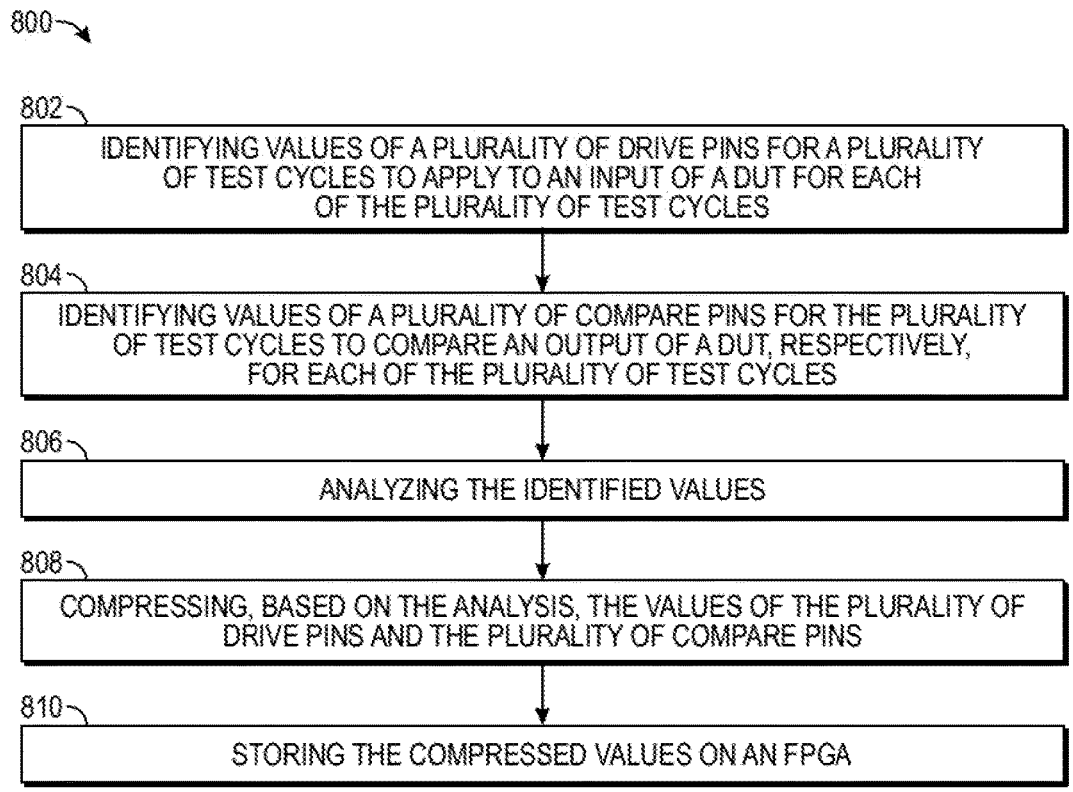
FIG. 8 illustrates an example of a process to compress test pattern data, in accordance with embodiments.

FIG. 8 illustrates an example of a process to compress pattern data, in accordance with embodiments. Process 800 may be performed by one or more elements, techniques, or systems that may be found in relation to FIGS. 1-7 and 10.

At block 802, the process may include identifying values of a plurality of drive pins for a plurality of test cycles to apply to an input of the DUT for each of the plurality of test cycles. In embodiments, a file may contain statements 102 of FIG. 1A that may describe V, M, or C vectors that include drive or input pins. In embodiments, the file may be interpreted or compiled by software.

At block 804, the process may include identifying values of a plurality of compare pins for the plurality of test cycles to compare an output of the DUT, respectively, for each of the plurality of test cycles. In embodiments, a file may contain statements 102 of FIG. 1A that may describe V, M, or C vectors that include compare or output pins. In embodiments, the file may be interpreted or compiled by software.

At block 806, the process may include analyzing the identified values. In embodiments, the software may use the syntax as described in FIG. 1A to analyze the identified drive pins and compare pins in preparation for the next process action.

At block 808, the process may include compressing, based on the analysis, the values of the plurality of drive pins and the plurality of compare pins. In embodiments, the software may determine a layout of binary objects as described related to FIGS. 1B, 2, and 3.

At block 810, the process may include storing the compressed values on the FPGA. In embodiments, this may include storing the compressed values into a file that may be stored on an FPGA, ASIC, or a computing device as described in FIGS. 5, 6, and 10.

Figure 9:
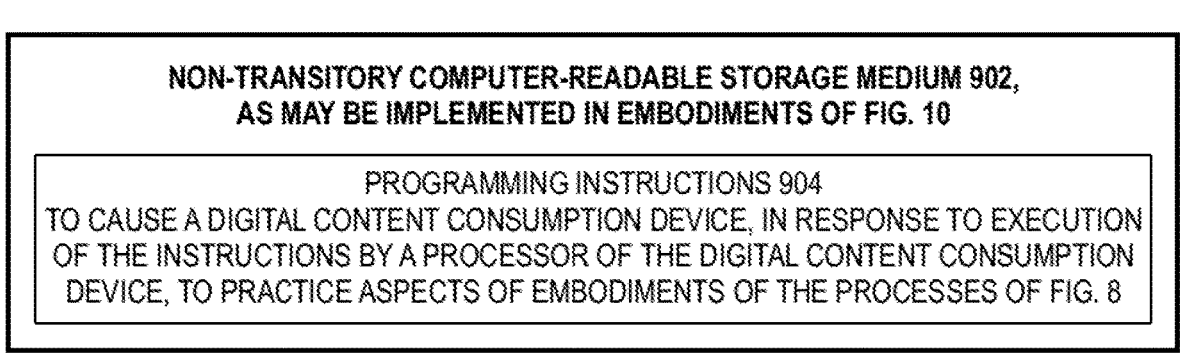
FIG. 9 illustrates computer readable media having instructions for practicing compressing test pattern data for an FPGA, in accordance with some embodiments FIG. 10 schematically illustrates a computing device, in accordance with embodiments.

FIG. 9 is a diagram 900 illustrating computer readable media having instructions for practicing compressing test pattern data for an FPGA, in accordance with some embodiments. In some embodiments, such computer readable media 902 may be included in a memory or storage device, which may be transitory or non-transitory, of the computer system 1000 in FIG. 10. In embodiments, instructions 904 may include assembler instructions supported by a processing device, or may include instructions in a high-level language, such as C, that can be compiled into object code executable by the processing device. In some embodiments, a persistent copy of the computer readable instructions 904 may be placed into a persistent storage device in the factory or in the field (through, for example, a machine-accessible distribution medium (not shown)). In some embodiments, a persistent copy of the computer readable instructions 904 may be placed into a persistent storage device through a suitable communication pathway (e.g., from a distribution server).

Figure 10:
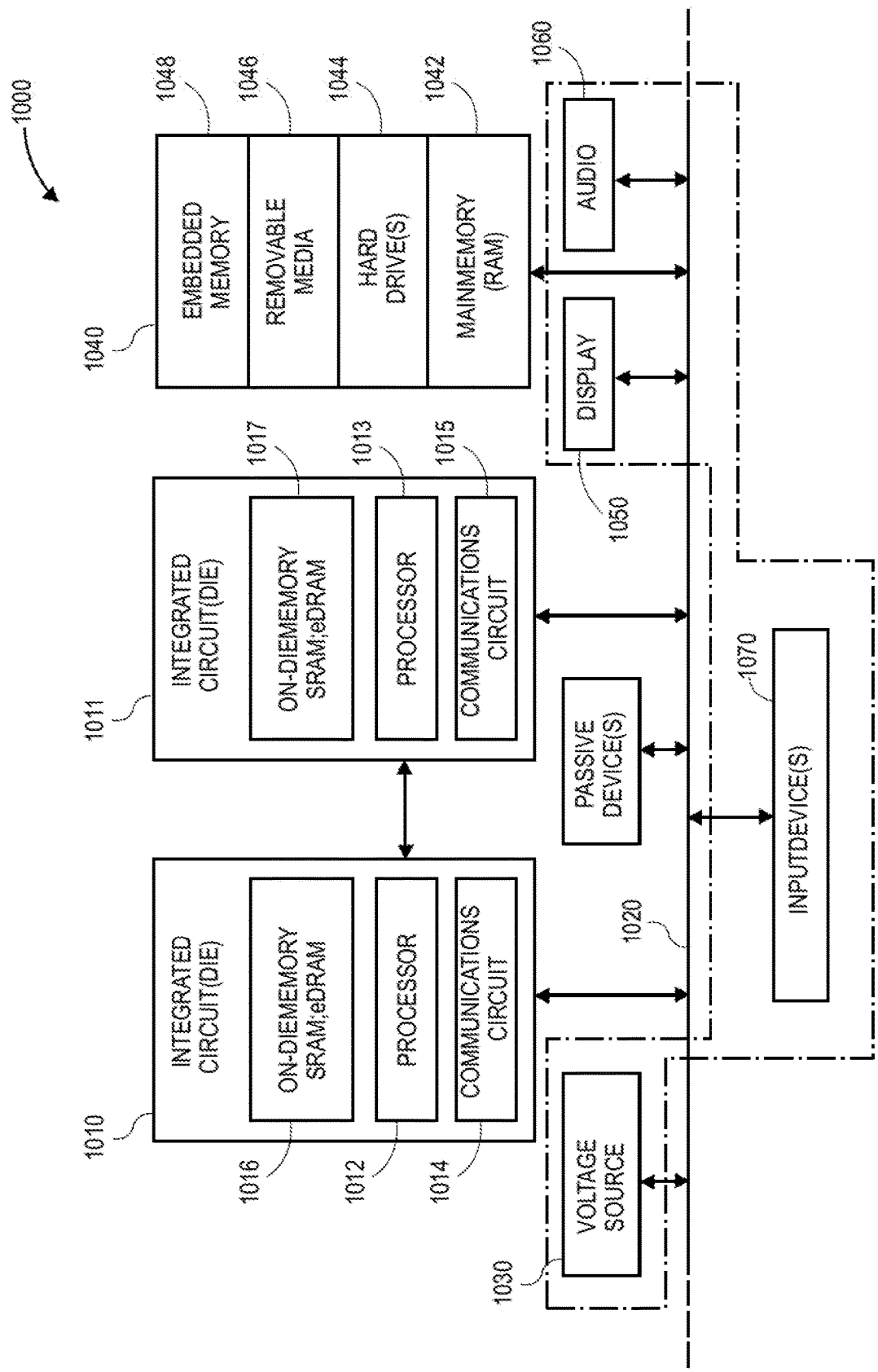

FIG. 10 schematically illustrates a computing device, in accordance with embodiments. The computer system 1000 (also referred to as the electronic system 1000) as depicted can embody magnetic cores cured using structures within a substrate layer, according to any of the several disclosed embodiments and their equivalents as set forth in this disclosure. The computer system 1000 may be a mobile device such as a netbook computer. The computer system 1000 may be a mobile device such as a wireless smart phone. The computer system 1000 may be a desktop computer. The computer system 1000 may be a hand-held reader. The computer system 1000 may be a server system. The computer system 1000 may be a supercomputer or high-performance computing system.

In an embodiment, the electronic system 1000 is a computer system that includes a system bus 1020 to electrically couple the various components of the electronic system 1000. The system bus 1020 is a single bus or any combination of busses according to various embodiments. The electronic system 1000 includes a voltage source 1030 that provides power to the integrated circuit 1010. In some embodiments, the voltage source 1030 supplies current to the integrated circuit 1010 through the system bus 1020.

The integrated circuit 1010 is electrically coupled to the system bus 1020 and includes any circuit, or combination of circuits according to an embodiment. In an embodiment, the integrated circuit 1010 includes a processor 1012 that can be of any type. As used herein, the processor 1012 may mean any type of circuit such as, but not limited to, a microprocessor, a microcontroller, a graphics processor, a digital signal processor, or another processor. In an embodiment, the processor 1012 includes, or is coupled with, magnetic cores cured using structures within a substrate layer, as disclosed herein. In an embodiment, SRAM embodiments are found in memory caches of the processor. Other types of circuits that can be included in the integrated circuit 1010 are a custom circuit or an application-specific integrated circuit (ASIC), such as a communications circuit 1014 for use in wireless devices such as cellular telephones, smart phones, pagers, portable computers, two-way radios, and similar electronic systems, or a communications circuit for servers. In an embodiment, the integrated circuit 1010 includes on-die memory 1016 such as static random-access memory (SRAM). In an embodiment, the integrated circuit 1010 includes embedded on-die memory 1016 such as embedded dynamic random-access memory (eDRAM).

In an embodiment, the integrated circuit 1010 is complemented with a subsequent integrated circuit 1011. Useful embodiments include a dual processor 1013 and a dual communications circuit 1015 and dual on-die memory 1017 such as SRAM. In an embodiment, the dual integrated circuit 1010 includes embedded on-die memory 1017 such as eDRAM.

In an embodiment, the electronic system 1000 also includes an external memory 1040 that in turn may include one or more memory elements suitable to the particular application, such as a main memory 1042 in the form of RAM, one or more hard drives 1044, and/or one or more drives that handle removable media 1046, such as diskettes, compact disks (CDs), digital variable disks (DVDs), flash memory drives, and other removable media known in the art. The external memory 1040 may also be embedded memory 1048 such as the first die in a die stack, according to an embodiment.

In an embodiment, the electronic system 1000 also includes a display device 1050, an audio output 1060. In an embodiment, the electronic system 1000 includes an input device such as a controller 1070 that may be a keyboard, mouse, trackball, game controller, microphone, voice-recognition device, or any other input device that inputs information into the electronic system 1000. In an embodiment, an input device 1070 is a camera. In an embodiment, an input device 1070 is a digital sound recorder. In an embodiment, an input device 1070 is a camera and a digital sound recorder.

As shown herein, the integrated circuit 1010 can be implemented in a number of different embodiments, including a package substrate having magnetic cores cured using structures within a substrate layer, according to any of the several disclosed embodiments and their equivalents, an electronic system, a computer system, one or more methods of fabricating an integrated circuit, and one or more methods of fabricating an electronic assembly that includes a package substrate having magnetic cores cured using structures within a substrate layer, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having magnetic cores cured using structures within a substrate layer embodiments and their equivalents. A foundation substrate may be included, as represented by the dashed line of FIG. 10. Passive devices may also be included, as is also depicted in FIG. 10.

EXAMPLES

The following paragraphs describe examples of various embodiments.

Example 1 may be a method to compress a test pattern onto a field programmable gate array (FPGA) to test a device under test (DUT), the method comprising: identifying values of a plurality of drive pins for a plurality of test cycles to apply to an input of the DUT for each of the plurality of test cycles; identifying values of a plurality of compare pins for the plurality of test cycles to compare an output of the DUT, respectively, for each of the plurality of test cycles; analyzing the identified values; compressing, based on the analysis, the values of the plurality of drive pins and the plurality of compare pins; and storing the compressed values on the FPGA.

Example 2 may include the method of example 1, wherein a value for a drive pin is a selected one of 0 or 1; and wherein a value for a compare pin is a selected one of 0, 1, or X.

Example 3 may include the method of example 1, wherein compressing further includes identifying a plurality of values of drive pins and compare pins for an identified test cycle.

Example 4 may include the method of example 1, wherein compressing further includes identifying, based on the analysis, a subset of drive pins and/or compare pins having respective values for N subsequent test cycles after an identified test cycle that are equal to the respective values of the subset of drive pins and/or compare pins of the first test cycle.

Example 5 may include the method of example 4, wherein compressing further includes: creating, based upon the analysis, a compressed page (CP) to store at least a portion of the subset of drive pins and/or compare pins and their respective values; and creating, based upon the analysis, a call header (CH) page associated with the CP, wherein the CH page includes an indication of one or more of: a memory address of the CP, a number of tester cycles to be generated from data in the CP, a memory map within the associated CP of per-pin data, and a configuration for each pin of the plurality of pins.

Example 6 may include the method of example 5, wherein the configuration for each pin includes a pin mode indication of a selected one of: "no data", "1 bit", "2 bits", or "4 bits".

Example 7 may include the method of example 6, further comprising, upon the pin mode indication of "no data" for a pin, a value for the pin is in the CH page and the pin data value is to remain constant for the number of tester cycles.

Example 8 may include the method of example 7, further comprising: upon the pin mode indication of "1 bit" for a pin, identifying a value for the pin to be one of two possible values; upon the pin mode indication of "2 bit" for the pin, identifying a value for the pin to be one of four possible values; and upon the pin mode indication of "4 bit" for the pin, identifying a value for the pin to be one of 16 possible values.

Example 9 may include the method of any one of examples 5-8, wherein the CH page further includes a pin location offset in the associated CP to indicate a first field beginning at the location offset, wherein the first field is to indicate a selected one of a command field or a data field.

Example 10 may include the method of example 9, wherein a command field further includes a command indicator and command data; and wherein the command indicator is to indicate the repeating of a prior state of the pin for the number of tester cycles indicated by the command data.

Example 11 may be a non-transitory computer readable medium that includes instructions, when executed on a processor, to cause the processor to: identify values of a plurality of drive pins for a plurality of test cycles to apply to an input of a DUT for each of the plurality of test cycles; identify values of a plurality of compare pins for the plurality of test cycles to compare an output of the DUT, respectively, for each of the plurality of test cycles; analyze the identified values; compress, based on the analysis, the values of the plurality of drive pins and the plurality of compare pins; and store the compressed values on the FPGA.

Example 12 may include the non-transitory computer readable medium of example 11, wherein to compress further includes to identify a plurality of values of drive pins and compare pins for an identified test cycle.

Example 13 may include the non-transitory computer readable medium of example 11, wherein to compress further includes to identify, based on the analysis, a subset of drive pins and/or compare pins having respective values for N subsequent test cycles after an identified test cycle that are equal to the respective values of the subset of drive pins and/or compare pins of the first test cycle.

Example 14 may include the non-transitory computer readable medium of example 13, wherein to compress further includes to: create, based upon the analysis, a compressed page (CP) to store at least a portion of the subset of drive pins and/or compare pins and their respective values; and create, based upon the analysis, a call header (CH) page associated with the CP, wherein the CH page includes an indication of one or more of: a memory address of the CP, a number of tester cycles to be generated from data in the CP, a memory map within the associated CP of per-pin data, and a configuration for each pin of the plurality of pins.

Example 15 may include the non-transitory computer readable medium of example 14, wherein the configuration for each pin includes a pin mode indication of a selected one of: "no data", "1 bit", "2 bits", or "4 bits."

Example 16 may be an apparatus comprising: means for identifying values of a plurality of drive pins for a plurality of test cycles to apply to an input of a device under test (DUT) for each of the plurality of test cycles; means for identifying values of a plurality of compare pins for the plurality of test cycles to compare an output of the DUT, respectively, for each of the plurality of test cycles; means for analyzing the identified values; means for compressing, based on the analysis, the values of the plurality of drive pins and the plurality of compare pins; and means for storing the compressed values on the field programmable gate array (FPGA).

Example 17 may include the apparatus of example 16, wherein a value for a drive pin is a selected one of 0 or 1; and wherein a value for a compare pin is a selected one of 0, 1, or X.

Example 18 may include the apparatus of example 16, wherein means for compressing further includes means for identifying a plurality of values of drive pins and compare pins for an identified test cycle.

Example 19 may include the apparatus of example 16, wherein means for compressing further includes: means for identifying, based on the analysis, a subset of drive pins and/or compare pins having respective values for N subsequent test cycles after an identified test cycle that are equal to the respective values of the subset of drive pins and/or compare pins of the first test cycle.

Example 20 may include the apparatus of example 19, wherein means for compressing further includes: means for creating, based upon the analysis, a compressed page (CP) to store at least a portion of the subset of drive pins and/or compare pins and their respective values; and means for creating, based upon the analysis, a call header (CH) page associated with the CP, wherein the CH page includes an indication of one or more of: a memory address of the CP, a number of tester cycles to be generated from data in the CP, a memory map within the associated CP of per-pin data, and a configuration for each pin of the plurality of pins.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A method to compress a test pattern onto a field programmable gate array (FPGA) to test a device under test (DUT), the method comprising:
    identifying values of a plurality of drive pins for a plurality of test cycles to apply to an input of the DUT for each of the plurality of test cycles;
    identifying values of a plurality of compare pins for the plurality of test cycles to compare an output of the DUT, respectively, for each of the plurality of test cycles;
    analyzing the identified values;

compressing, based on the analysis, the values of the plurality of drive pins and the plurality of compare pins; and storing the compressed values on the FPGA.

2. The method of claim 1, wherein a value for a drive pin is a selected one of 0 or 1; and wherein a value for a compare pin is a selected one of 0, 1, or X.

3. The method of claim 1, wherein compressing further includes identifying a plurality of values of drive pins and compare pins for an identified test cycle.

4. The method of claim 1, wherein compressing further includes identifying, based on the analysis, a subset of drive pins and/or compare pins having respective values for N subsequent test cycles after an identified test cycle that are equal to respective values of the subset of drive pins and/or compare pins of a first test cycle.

5. The method of claim 4, wherein compressing further includes:

creating, based upon the analysis, a compressed page (CP) to store at least a portion of the subset of drive pins and/or compare pins and their respective values; and creating, based upon the analysis, a call header (CH) page associated with the CP, wherein the CH page includes an indication of one or more of:

a memory address of the CP, a number of tester cycles to be generated from data in the CP, a memory map within the associated CP of per-pin data, and a configuration for each pin of the plurality of pins.

6. The method of claim 5, wherein the configuration for each pin includes a pin mode indication of a selected one of: "no data", "1 bit", "2 bits", or "4 bits".

7. The method of claim 6, further comprising, upon the pin mode indication of "no data" for a pin, a value for the pin is in the CH page and the pin data value is to remain constant for the number of tester cycles.

8. The method of claim 7, further comprising:

upon the pin mode indication of "1 bit" for a pin, identifying a value for the pin to be one of two possible values;

upon the pin mode indication of "2 bit" for the pin, identifying a value for the pin to be one of four possible values; and upon the pin mode indication of "4 bit" for the pin, identifying a value for the pin to be one of 16 possible values.

9. The method of claim 5, wherein the CH page further includes a pin location offset in the associated CP to indicate a first field beginning at the location offset, wherein the first field is to indicate a selected one of a command field or a data field.

10. The method of claim 9, wherein a command field further includes a command indicator and command data; and wherein the command indicator is to indicate a repeating of a prior state of the pin for the number of tester cycles indicated by the command data.

11. A non-transitory computer readable medium that includes instructions, when executed on a processor, to cause the processor to:

identify values of a plurality of drive pins for a plurality of test cycles to apply to an input of a DUT for each of the plurality of test cycles;

identify values of a plurality of compare pins for the plurality of test cycles to compare an output of the DUT, respectively, for each of the plurality of test cycles;

analyze the identified values;

compress, based on the analysis, the values of the plurality of drive pins and the plurality of compare pins; and store the compressed values on the FPGA.

12. The non-transitory computer readable medium of claim 11, wherein to compress further includes to identify a plurality of values of drive pins and compare pins for an identified test cycle.

13. The non-transitory computer readable medium of claim 11, wherein to compress further includes to identify, based on the analysis, a subset of drive pins and/or compare pins having respective values for N subsequent test cycles after an identified test cycle that are equal to respective values of the subset of drive pins and/or compare pins of a first test cycle.

14. The non-transitory computer readable medium of claim 13, wherein to compress further includes to:

create, based upon the analysis, a compressed page (CP) to store at least a portion of the subset of drive pins and/or compare pins and their respective values; and create, based upon the analysis, a call header (CH) page associated with the CP, wherein the CH page includes an indication of one or more of:

a memory address of the CP, a number of tester cycles to be generated from data in the CP, a memory map within the associated CP of per-pin data, and a configuration for each pin of the plurality of pins.

15. The non-transitory computer readable medium of claim 14, wherein the configuration for each pin includes a pin mode indication of a selected one of: "no data", "1 bit", "2 bits", or "4 bits."

16. An apparatus comprising:

means for identifying values of a plurality of drive pins for a plurality of test cycles to apply to an input of a device under test (DUT) for each of the plurality of test cycles;

means for identifying values of a plurality of compare pins for the plurality of test cycles to compare an output of the DUT, respectively, for each of the plurality of test cycles;

means for analyzing the identified values;

means for compressing, based on the analysis, the values of the plurality of drive pins and the plurality of compare pins; and means for storing the compressed values on the field programmable gate array (FPGA).

17. The apparatus of claim 16, wherein a value for a drive pin is a selected one of 0 or 1; and wherein a value for a compare pin is a selected one of 0, 1, or X.

18. The apparatus of claim 16, wherein means for compressing further includes means for identifying a plurality of values of drive pins and compare pins for an identified test cycle.

19. The apparatus of claim 16, wherein means for compressing further includes: means for identifying, based on the analysis, a subset of drive pins and/or compare pins having respective values for N subsequent test cycles after an identified test cycle that are equal to respective values of the subset of drive pins and/or compare pins of a first test cycle.

20. The apparatus of claim 19, wherein means for compressing further includes:

means for creating, based upon the analysis, a compressed page (CP) to store at least a portion of the subset of drive pins and/or compare pins and their respective values; and means for creating, based upon the analysis, a call header (CH) page associated with the CP, wherein the CH page includes an indication of one or more of:
  a memory address of the CP,
  a number of tester cycles to be generated from data in the CP,
  a memory map within the associated CP of per-pin data, and
  a configuration for each pin of the plurality of pins.

* * * * *